United States Patent
Kim et al.

(10) Patent No.: US 11,349,094 B2
(45) Date of Patent: *May 31, 2022

(54) ORGANIC LIGHT EMITTING DIODE AND ORGANIC LIGHT EMITTING DIODE DISPLAY DEVICE INCLUDING THE SAME

(71) Applicant: SAMSUNG DISPLAY CO., LTD., Yongin-si (KR)

(72) Inventors: Dong Chan Kim, Gunpo-si (KR); Yi Su Kim, Seoul (KR); Byoung Duk Lee, Seongnam-si (KR); Yoon Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1117 days.

This patent is subject to a terminal disclaimer.

(21) Appl. No.: 15/365,982

(22) Filed: Dec. 1, 2016

(65) Prior Publication Data

US 2017/0186985 A1 Jun. 29, 2017

(30) Foreign Application Priority Data

Dec. 28, 2015 (KR) .................. 10-2015-0187560

(51) Int. Cl.
*H01L 51/50* (2006.01)
*B82Y 20/00* (2011.01)
*H01L 27/32* (2006.01)

(52) U.S. Cl.
CPC ............ *H01L 51/502* (2013.01); *B82Y 20/00* (2013.01); *H01L 51/506* (2013.01); *H01L 51/5076* (2013.01); *H01L 27/3244* (2013.01); *Y10S 977/774* (2013.01); *Y10S 977/824* (2013.01); *Y10S 977/826* (2013.01); *Y10S 977/952* (2013.01)

(58) Field of Classification Search
CPC ... H01L 51/502; H01L 51/506; H01L 5/5076; H05B 33/14
See application file for complete search history.

(56) References Cited

U.S. PATENT DOCUMENTS

| 10,147,844 B2 * | 12/2018 | Kim et al. ............ H01L 51/502 |
| 2007/0103068 A1 * | 5/2007 | Bawendi et al. ...... B82Y 20/00 313/506 |
| 2011/0291071 A1 | 12/2011 | Kim et al. |

(Continued)

FOREIGN PATENT DOCUMENTS

| KR | 10-0971688 B1 | 7/2010 |
| KR | 10-2013-0105544 A | 9/2013 |

(Continued)

*Primary Examiner* — Dylan C Kershner
(74) *Attorney, Agent, or Firm* — Lewis Roca Rothgerber Christie LLP

(57) ABSTRACT

An organic light emitting element includes a first electrode a second electrode that faces the first electrode, an emission layer between the first electrode and the second electrode, the emission layer including quantum dots, and a hole transport layer between the first electrode and the emission layer. The quantum dots include at least one of a Group I-VI compound, a Group II-VI compound, and a Group III-VI compound. The hole transport layer includes at least one of a p-doped Group I-VI compound, a p-doped Group II-VI compound, and a p-doped Group III-VI compound.

9 Claims, 6 Drawing Sheets

(56) References Cited

U.S. PATENT DOCUMENTS

| 2014/0367721 | A1 | 12/2014 | Mahler et al. | |
|---|---|---|---|---|
| 2015/0076469 | A1 | 3/2015 | Ikemizu et al. | |
| 2017/0186909 | A1* | 6/2017 | Kim | H01L 51/5004 |
| 2018/0254421 | A1* | 9/2018 | Kinge | H01L 51/426 |

FOREIGN PATENT DOCUMENTS

| KR | 10-1355120 B1 | 1/2014 |
|---|---|---|
| KR | 10-2014-0143406 A | 12/2014 |
| KR | 10-2015-0017697 A | 2/2015 |
| WO | WO 2013/140083 A1 | 9/2013 |

\* cited by examiner

ORGANIC LIGHT EMITTING DIODE AND ORGANIC LIGHT EMITTING DIODE DISPLAY DEVICE INCLUDING THE SAME

CROSS-REFERENCE TO RELATED APPLICATION

Korean Patent Application No. 10-2015-0187560, filed on Dec. 28, 2015, in the Korean Intellectual Property Office, and entitled: "Organic Light Emitting Diode and Organic Light Emitting Diode Display Device Including the Same," is incorporated by reference herein in its entirety.

BACKGROUND

1. Field

Embodiments relate to an organic light emitting element and an organic light emitting display device including the same.

2. Description of the Related Art

An organic light emitting diode (OLED) display device is a self-emissive display element having advantages of a wide viewing angle, excellent contrast, and a fast response time.

The organic light emitting diode (OLED) display device includes an organic light emitting element for light emission. The organic light emitting element forms excitons from combination of electrons injected from one electrode and holes injected from another electrode in an emission layer. The excitons emit energy in the form of light is emitted.

SUMMARY

Embodiments are directed to an organic light emitting element including a first electrode a second electrode that faces the first electrode, an emission layer between the first electrode and the second electrode, the emission layer including quantum dots, and a hole transport layer between the first electrode and the emission layer. The quantum dots include at least one of a Group I-VI compound, a Group II-VI compound, and a Group III-VI compound. The hole transport layer includes at least one of a p-doped Group I-VI compound, a p-doped Group II-VI compound, and a p-doped Group III-VI compound.

The quantum dots may include at least one of $In_2S_3$, $Cu_2S$, $Ag_2S$, ZnSe, ZnS, ZnO, ZnTe, ZnSe, and ZnS.

The quantum dots may each have a core/shell structure in which the shell covers the core. The core and the shell may each include at least one of $In_2S_3$, $Cu_2S$, $Ag_2S$, ZnSe, ZnS, ZnO, ZnTe, ZnSe, and ZnS.

The core may include at least one of $In_2S_3$, $Cu_2S$, and $Ag_2S$. The shell may include at least one of ZnSe and ZnS.

The hole transport layer may include at least one of p-$In_2S_3$, p-$Cu_2S$, p-$Ag_2S$, p-ZnSe, p-ZnS, p-ZnO, p-ZnTe, p-ZnSe, and p-ZnS.

A p-dopant of the at least one of p-$In_2S_3$, p-$Cu_2S$, p-$Ag_2S$, p-ZnSe, p-ZnS, p-ZnO, p-ZnTe, p-ZnSe, and p-ZnS may be a metal or a halogen element.

The hole transport layer may include a compound doped with the p-type dopant, wherein the compound of the hole transport layer is the same as the compound of the core of the quantum dots.

The core of the quantum dots may include at least one of $In_2S_3$, $Cu_2S$, and $Ag_2S$. The shell of the quantum dots may include at least one of ZnSe and ZnS. The hole transport layer includes at least one of p-ZnSe, p-ZnS, and p-ZnTe.

The organic light emitting element may further include an electron transport layer between the emission layer and the second electrode.

The electron transport layer may include at least one of an n-doped Group I-VI compound, an n-doped Group II-VI compound, and an n-doped Group III-VI compound.

The electron transport layer may include at least one of n-$In_2S_3$, n-$Cu_2S$, n-$Ag_2S$, n-ZnSe, n-ZnS, n-ZnO, n-ZnTe, n-ZnSe, and n-ZnS.

The core of the quantum dots may include at least one of $In_2S_3$, $Cu_2S$, and $Ag_2S$. The shell of the quantum dots may include at least one of ZnSe and ZnS. The hole transport layer includes at least one of p-ZnSe, p-ZnS, and p-ZnTe.

Embodiments are also directed to an organic light emitting diode display, including a substrate, a thin film transistor on the substrate, a first electrode connected with the thin film transistor, a hole transport layer on the first electrode, an emission layer on the hole transport layer, the emission layer including quantum dots, and a second electrode on the emission layer. The quantum dots may include at least one of a Group I-VI compound, a Group II-VI compound, and a Group III-VI compound. The hole transport layer may include at least one of a p-doped Group I-VI compound, a p-doped Group II-VI compound, and a p-doped Group III-VI compound.

The quantum dots may include at least one of $In_2S_3$, $Cu_2S$, $Ag_2S$, ZnSe, ZnS, ZnO, ZnTe, ZnSe, and ZnS.

The quantum dots may include a core/shell structure in which the shell covers the core. The core may include at least one of $In_2S_3$, $Cu_2S$, and $Ag_2S$. The shell may include at least one of ZnSe and ZnS. The hole transport layer may include at least one of p-ZnSe, p-ZnS, and p-ZnTe.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
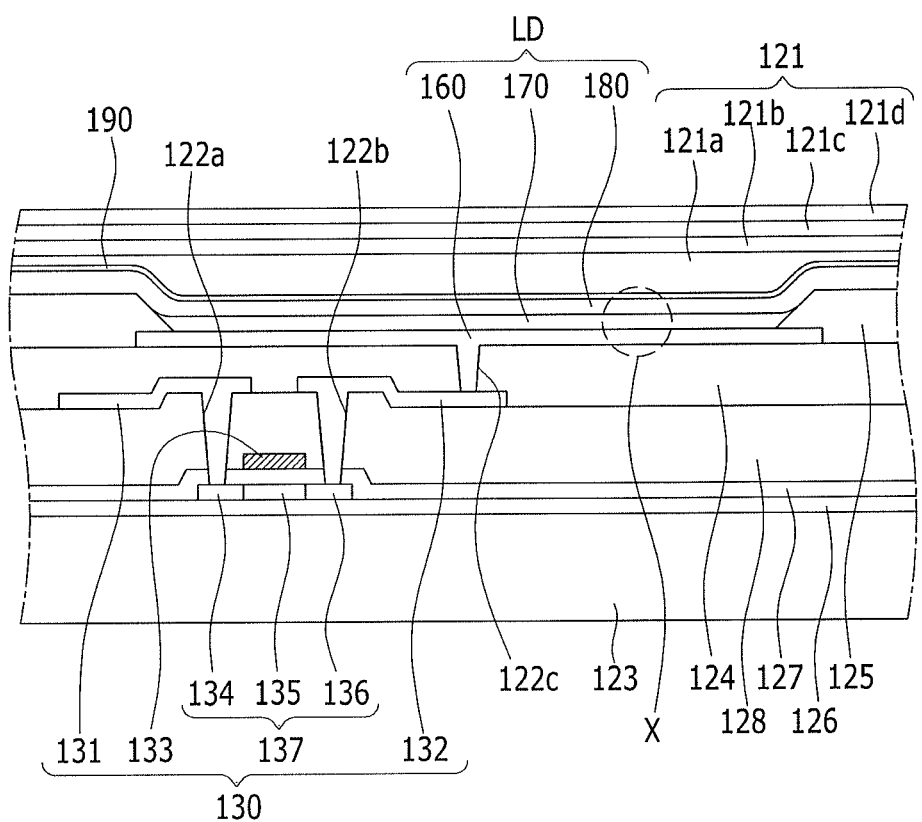
FIGS. 1 and 6 illustrate a cross-sectional views of an organic light emitting diode display according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Figure 2:
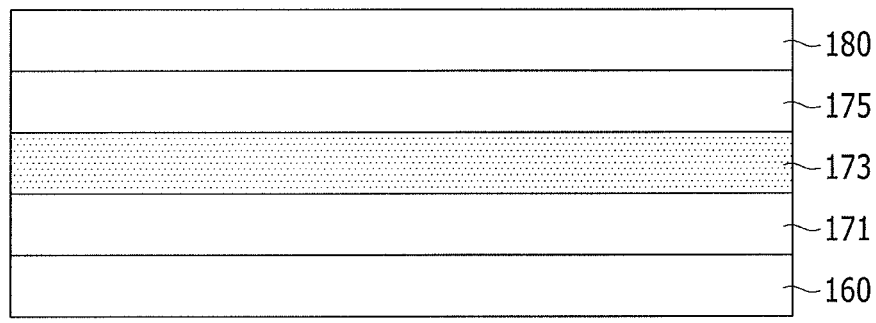
FIG. 2 illustrates a partially enlarged cross-sectional view of the organic light emitting diode display of FIG. 1.

FIG. 1 illustrates a cross-sectional view of an organic light emitting diode display according to an exemplary embodiment, and FIG. 2 illustrates a partially enlarged cross-sectional view of the organic light emitting diode display of FIG. 1.

Referring to FIG. 1 and FIG. 2, an organic light emitting diode (OLED) display device according to an exemplary embodiment may include a substrate 123, a thin film transistor 130, a first electrode 160, a second electrode 180, and an emission element layer 170 disposed between the first electrode 160 and the second electrode 180.

The emission element layer 170 may include a hole transport layer 171, an emission layer 173, and an electron transport layer 175.

The hole transport layer 171 and the electron transport layer 175 may respectively be formed as a single layer or as multiple layers. For example, the hole transport layer 171 may include a hole injection layer and a hole transporting layer. The electron transport layer 175 may include an electron transporting layer and an electron injection layer.

The first electrode 160 may be an anode and the second electrode 180 may be a cathode, or the first electrode 160 may be a cathode and the second electrode 180 may be an anode.

The substrate 123 may be an insulating substrate. For example, the substrate may be made of glass, quartz, ceramic, plastic, or the like. In some implementations, the substrate 123 may be a metallic substrate that is made of stainless steel or the like or may be made of an organic material such as a polycarbonate, polymethylmethacrylate, polyethylene terephthalate, polyethylene naphthalate, a polyamide, polyether sulfone, or a combination thereof, or of a silicon wafer.

A substrate buffer layer 126 may be provided on the substrate 123. The substrate buffer layer 126 may be made of a suitable material to prevent permeation of an impurity element, and provide a flat surface. For example, the substrate buffer layer 126 may be formed of at least one of a silicon nitride ($SiN_x$) layer, a silicon oxide ($SiO_y$) layer, and a silicon oxynitride ($SiO_xN_y$) layer. In some implementations, the substrate buffer layer 126 may be omitted, depending on types and process conditions of the substrate 123.

A driving semiconductor layer 137 may be provided on the substrate buffer layer 126. The driving semiconductor layer 137 may be formed as a polysilicon layer. The driving semiconductor layer 137 may include a channel region 135 that is not doped with an impurity, a source region 134, and a drain region 136. The source region 134 and the drain region 136 may be doped and may be disposed at opposite ends of the channel region 135. The doped ion impurity may be selected depending on the type of a thin film transistor.

A gate insulating layer 127 that is formed of a silicon nitride (SiNx) or a silicon oxide (SiOy) may be provided on the driving semiconductor layer 137. Gate wires including a driving gate electrode 133 may be provided on the gate insulating layer 127. The driving gate electrode 133 may overlap at least a part of the driving semiconductor layer 137. For example, the driving gate electrode 133 may overlap the channel region 135.

An interlayer insulating layer 128 that covers the driving gate electrode 133 may be provided on the gate insulating layer 127. A first contact hole 122a and a second contact hole 122b that expose the source region 134 and the drain region 136 may be provided in the gate insulating layer 127 and the interlayer insulating layer 128. Similar to the gate insulating layer 127, the interlayer insulating layer 128 may be made by using a ceramic-based material such as a silicon nitride (SiNx) or a silicon oxide (SiOy).

Data wires including a source driving electrode 131 and a driving drain electrode 132 may be provided on the interlayer insulating layer 128. The driving source electrode 131 and the driving drain electrode 132 may be respectively connected with the source region 134 and the drain region 136 of the driving semiconductor layer 137 through the first contact hole 122a and the second contact hole 122b respectively provided in the interlayer insulating layer 128 and the gate insulating layer 127.

As described, the driving semiconductor layer 137, the driving gate electrode 133, the driving source electrode 131, and the driving drain electrode 132 form a driving thin film transistor 130. The configuration of the driving thin film transistor 130 may be variously modified.

A planarization layer 124 covering the data wire may be provided on the interlayer insulating layer 128. The planarization layer 124 may serve to remove and planarize a step in order to increase emission efficiency of the organic light emitting element to be formed thereon. The planarization layer 124 may include a third contact hole 122c exposing a part of the drain electrode 132.

The planarization layer 124 may be made of one or more materials including a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

In some implementations, one of the planarization layer 124 and the interlayer insulating layer 128 may be omitted.

A first electrode of the organic light emitting element, for example, a pixel electrode 160, may be formed on the planarization layer 124. The organic light emitting diode device may include a plurality of pixel electrodes 160 that are disposed for each of a plurality of pixels, respectively. The plurality of pixel electrodes 160 may be spaced apart from each other. The pixel electrode 160 may be connected to the drain electrode 132 through the third contact hole 122c of the planarization layer.

A pixel defining layer 125 including an opening that exposes the pixel electrode 160 may be formed is provided on the planarization layer 124. The pixel defining layer 125 may have a plurality of openings, each opening being formed for a respective one of the pixels. The emission element layer 170 may be formed with respect to each opening that is formed by the pixel defining layer 125. Accordingly, a pixel area in which each emission element layer 170 is located in at an opening defined by the pixel defining layer 125 may be formed.

The pixel electrode 160 may be disposed to correspond to the opening of the pixel defining layer 125. In some implementations, the pixel electrode 160 may be disposed below the pixel defining layer 125 such that a part of the pixel electrode 160 overlaps with the pixel defining layer 125.

The pixel defining layer 125 may be made of a resin such as a polyacrylate resin and a polyimide, a silica-based inorganic material, or the like.

The emission element layer 170 may be provided on the pixel electrode 160. A structure of the emission element layer 170 will be described in detail below.

The second electrode, for example, a common electrode 180, may be provided on the light-emitting element layer 170. As described, an organic light emitting element LD including the pixel electrode 160, the emission element layer 170, and the common electrode 180 may be formed.

The pixel electrode 160 and the common electrode 180 may be made of a transparent conductive material or a transflective or reflective conductive material. According to kinds of materials forming the pixel electrode 160 and the common electrode 180, the organic light emitting diode device may be a top emission type, a bottom emission type, or a double-sided emission type.

An overcoat 190 covering and protecting the common electrode 180 may be formed as an organic layer on the common electrode 180.

In addition, a thin film encapsulation layer 121 may be formed on the overcoat 190. The thin film encapsulation layer 121 may encapsulate and protect the organic light emitting element LD and a driving circuit part formed on the substrate 123 from the external environment.

The thin film encapsulation layer 121 may include organic encapsulation layers 121a and 121c and inorganic encapsulation layers 121b and 121d that are alternately laminated. In FIG. 1, for example, a case where two organic encapsulation layers 121a and 121c and two inorganic encapsulation layers 121b and 121d are alternately laminated to configure the thin film encapsulation layer 121 is illustrated. The structure of the thin film encapsulation layer 121 may be variously modified as desired.

An organic light emitting element (LD) according to the exemplary embodiment will be described in detail with reference to FIG. 2. FIG. 2 is a partially enlarged cross-sectional view of the organic light emitting diode display of FIG. 1 (i.e., the portion X in FIG. 1).

The organic light emitting element according to the exemplary embodiment may have a structure in which the first electrode 160, the hole transport layer 171, the emission layer 173, the electron transport layer 175, and the second electrode 180 are sequentially layered.

For example, the emission element layer 170 of FIG. 1 may include the hole transport layer 171, the emission layer 173, and the electron transport layer 175 of FIG. 2.

When the first electrode 160 is an anode, a material selected from materials having a high work function may be selected for easy hole injection.

The first electrode 160 according to the exemplary embodiment may be a transparent electrode, and may be formed of a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal such as sodium (Ca), ytterbium (Yb), aluminum (Al), silver (Ag), and magnesium (Mg), or a conductive polymer such as graphene, carbon nanotubes, or poly(3,4-ethylenedioxythiophene) polystyrene sulfonate (PEDOT:PSS), with a small thickness. In some implementations, the first electrode 160 may have a structure in which two or more layers are layered.

The hole transport layer 171 may be disposed on the first electrode 160. The hole transport layer 171 may serve to inject and transport holes to the emission layer 173 from the first electrode 160.

The hole transport layer 171 may include a Group I-VI compound, Group II-VI compound, Group III-VI compound, or a combination thereof. These compounds are doped with a p-type dopant.

Here, the p-type dopant may be a metal or a halogen element.

For example, the hole transport layer 171 may include, for example, one or more of p-$In_2S_3$, p-$Cu_2S$, p-$Ag_2S$, p-ZnSe, p-ZnS, p-ZnO, p-ZnTe, p-ZnSe, and p-ZnS, where p-$In_2S_3$, p-$Cu_2S$, p-$Ag_2S$, p-ZnSe, p-ZnS, p-ZnO, p-ZnTe, p-ZnSe, and p-ZnS refer to $In_2S_3$, $Cu_2S$, $Ag_2S$, ZnSe, ZnS, ZnO, ZnTe, ZnSe, and ZnS doped with a p-type dopant.

The hole transport layer 171 includes a material to which the p-type dopant is applied such that a driving voltage of the organic light emitting element can be reduced, thereby improving a hole injection characteristic.

The hole transport layer 171 may be formed as a single layer. In some implementations, the hole transport layer 171 may be formed as a multilayer where two or more layers are stacked.

The emission layer 173 may be provided on the hole transport layer 171. The emission layer 173 may include an emission material that displays a specific color. For example, the emission layer 173 may display a basic color such as blue, green, or red, or a combination thereof.

The emission material included in the emission layer 173 according to the exemplary embodiment may include quantum dots.

The quantum dots included in the emission layer 173 according to the exemplary embodiment may include a Group I-VI compound, a Group II-VI compound, a Group III-VI compound, or a combination thereof.

The quantum dots included in the emission layer 173 may include one or more selected from $In_2S_3$, $Cu_2S$, $Ag_2S$, ZnSe, ZnS, ZnO, ZnTe, ZnSe, and ZnS, as examples.

The quantum dots may have a core/shell structure where one quantum dot surrounds another quantum dot. An interface between the core and the shell may have a concentration gradient, such that a concentration of an element existing in the shell is gradually reduced nearing to the center thereof.

The core may be a Group I-VI compound, a Group II-VI compound, or a Group III-VI compound. The core may include one or more materials selected from $In_2S_3$, $Cu_2S$, $Ag_2S$, ZnSe, ZnS, ZnO, ZnTe, ZnSe, and ZnS, as examples. The shell may be a Group I-VI compound, a Group II-VI compound, or a Group III-VI compound. The shell may include one or more materials selected from $In_2S_3$, $Cu_2S$, $Ag_2S$, ZnSe, ZnS, ZnO, ZnTe, ZnSe, and ZnS, as examples. For example, the shell may include ZnSe or ZnS.

An average particle diameter of the core of the core/shell quantum dot may be 2 nm to 5 nm. An average thickness of the shell may be 3 nm to 5 nm. The average particle diameter of the quantum dot may be 5 nm to 10 nm. In the case where the core, the shell, and the quantum dot satisfy the aforementioned range of the average particle diameter or average thickness, a characteristic behavior as the quantum dot may be performed. In a composition for forming a pattern, excellent dispersibility may be secured. In the aforementioned range, by variously selecting the particle diameter of the core, the average thickness of the shell, and the average particle diameter of the quantum dots, light emitting colors of the quantum dots and/or semiconductor characteristics of the quantum dots and the like may be variously selected.

Further, the quantum dots may be in a suitable form such as spherical, pyramidal, multi-armed, or cubic nanoparticles, nanotubes, nanowires, nanofibers, or nanoplate-shaped particles.

The quantum dot may further include a ligand that is formed in the surface of the shell and chemically bonded thereto. The ligand may include an organic functional group. For example, the ligand may include oleate or trioctyl phosphine.

The hole transport layer 171 according to an embodiment may include P-type quantum dots where a P-type dopant is applied to quantum dots that are the same as the quantum dots included in the emission layer 173.

A general hole transport layer applied to a organic light emitting diode display generally includes an organic material. An energy level of the hole transport layer that includes the organic material and an energy level of the emission layer may be significantly different from each other. Such an energy level difference between the hole transport layer and the emission layer may interfere with hole injection into the emission layer.

In contrast, the electron transport layer including a zinc (Zn) compound and the emission layer may not have a significant energy level difference. Thus electron injection may be be relatively smoothly performed in the organic light emitting diode display.

As described above, hole injection may not be smoothly performed by a general hole injection layer due to the big energy level difference between the hole transport layer and the emission layer, but electron injection may be smoothly performed when the electron transport layer and the emission layer have a small energy level difference. Accordingly, electrons and holes combined in the emission layer may be imbalanced, and thereby, stability and luminous efficiency of a general organic light emitting element may be deteriorated.

In the organic light emitting diode display including the quantum dots according to the exemplary embodiment, the hole transport layer may be formed with quantum dots to which the p-type dopant is applied. The quantum dots may have a similar energy level as the quantum dots included in the emission layer such that an energy level difference between the hole transport layer and the emission layer may be minimized. Accordingly hole injection may be smoothly performed. When the holes are smoothly injected, balancing between the electrons and holes combined in the emission layer may be enhanced, thereby improving stability and emission efficiency of the organic light emitting element.

The electron transport layer 175 may be disposed on the emission layer 173. The electron transport layer 175 may serve to inject and transport electrons to the emission layer 173 from the second electrode 180.

The electron transport layer 175 may include an N-type Group I-VI compound, Group II-VI compound, Group III-VI compound, or a combination thereof. These compounds may be doped with an n-type dopant.

For example, the electron transport layer 175 may include one or more selected from n-$In_2S_3$, n-$Cu_2S$, n-$Ag_2S$, n-ZnSe, n-ZnS, n-ZnO, n-ZnTe, n-ZnSe, and n-ZnS, as examples.

The electron transport layer 175 may be formed as a single layer. In some implementations, the electron transport layer 175 may be formed as a multilayer where two or more layers are stacked.

The second electrode 180 may be provided on the electron transport layer 175. In the organic light emitting diode display according to the exemplary embodiment, the first electrode 160 may be provided as an anode, and the second electrode 180 may be a cathode.

The second electrode 180 may be a transparent electrode. The second electrode 180 may be formed of a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal such as sodium (Ca), ytterbium (Yb), aluminum (Al), silver (Ag), and magnesium (Mg), or a conductive polymer such as graphene, carbon nanotubes, or PEDOT:PSS, with a small thickness. In some implementations, the second electrode 180 may have a structure in which two or more layers are stacked.

Hereinafter, an energy level of the organic light emitting diode display according to the exemplary embodiment will be described with reference to FIG. 3 to FIG. 5.

Figure 3:
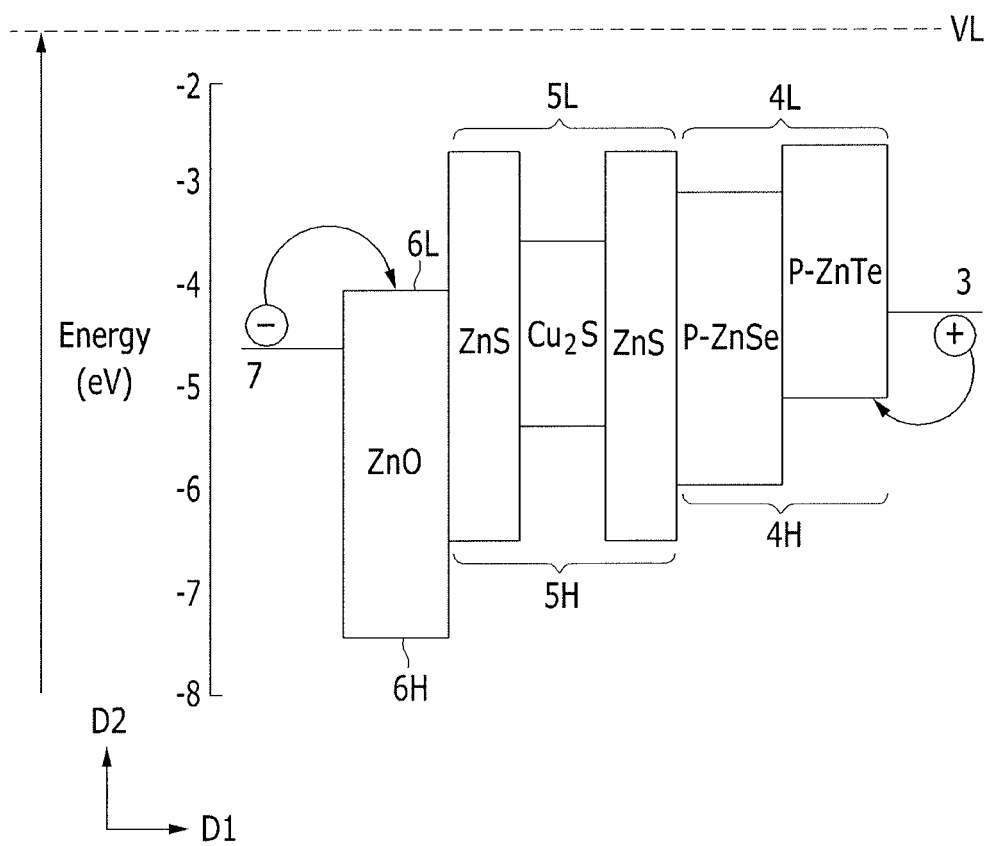
FIG. 3 to FIG. 5 illustrate schematic diagrams depicting an energy level of each layer of the organic light emitting diode display according to the exemplary embodiment.
Figure 4:
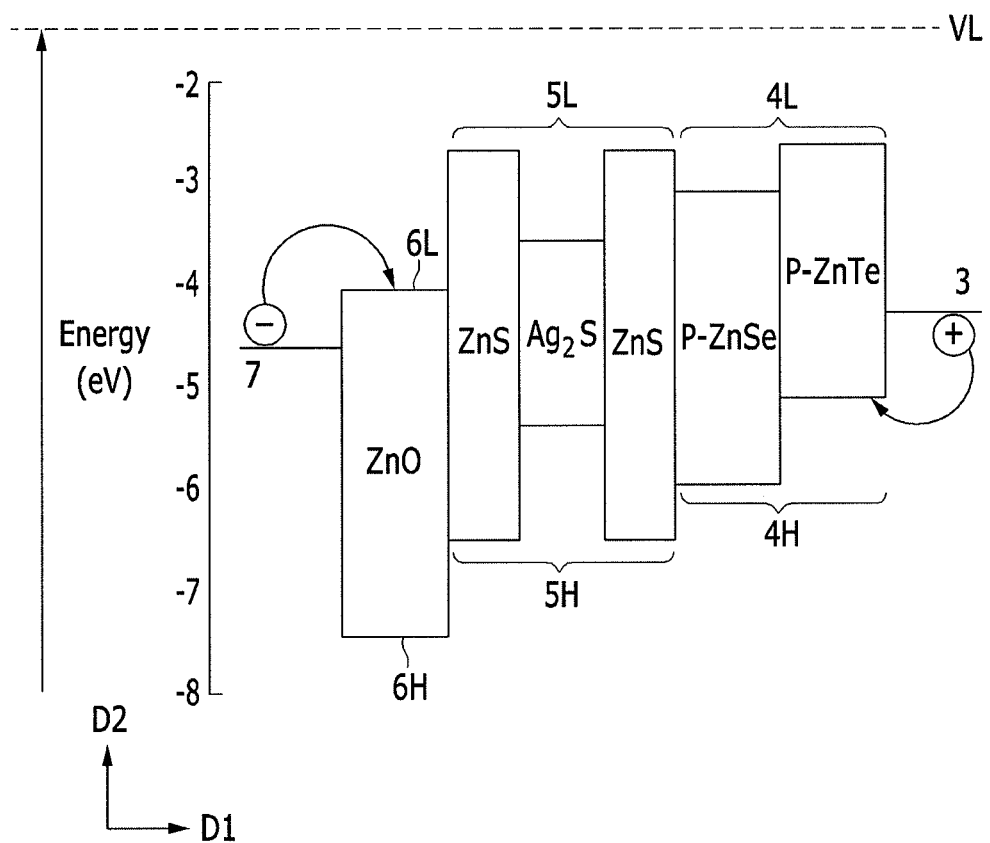
Figure 5:
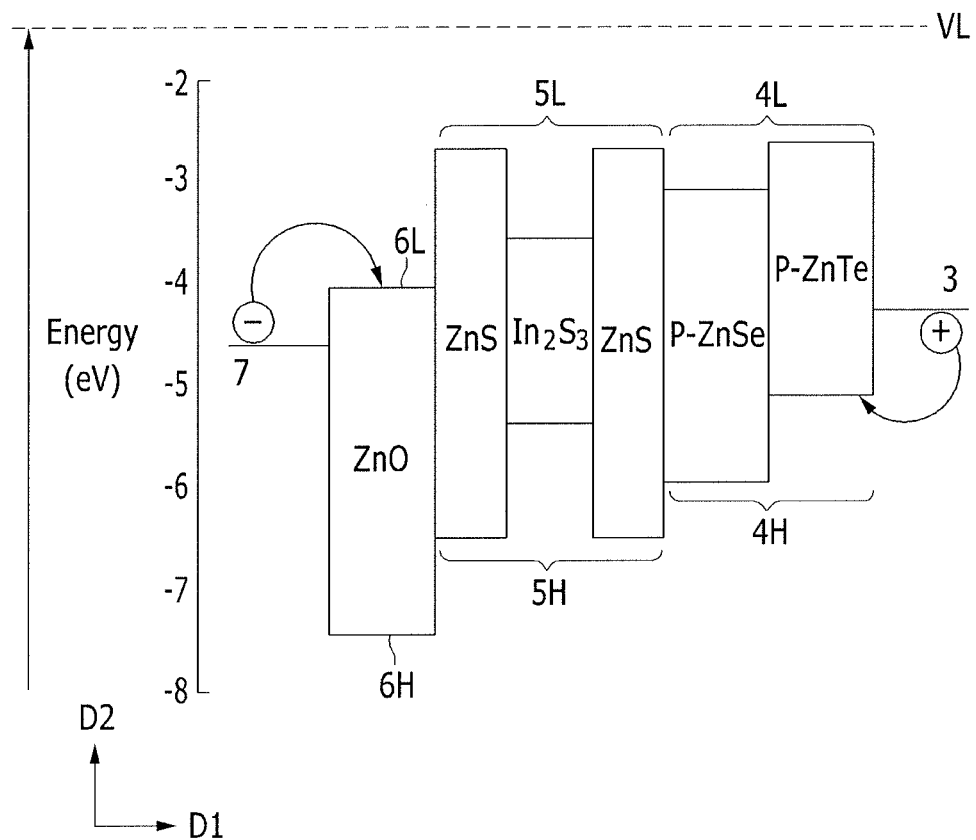
Figure 6:
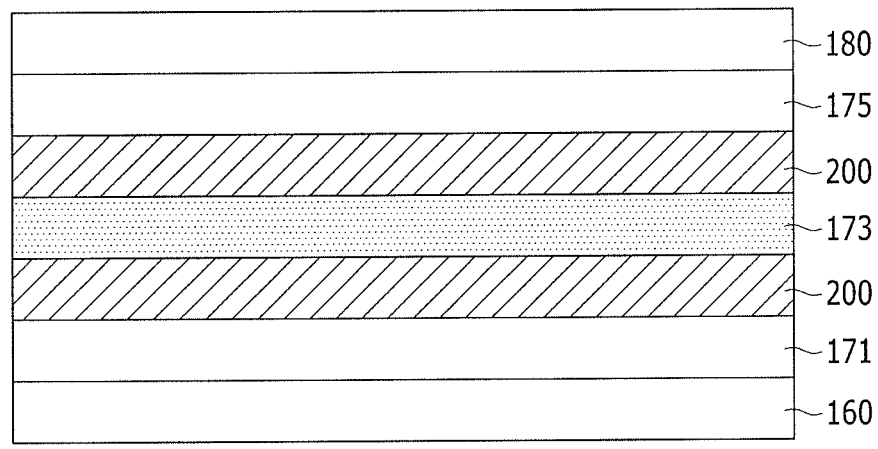

FIG. 3 to FIG. 5 are schematic diagrams that show an energy level of each level of the organic light emitting diode display according to the exemplary embodiment.

FIG. 3 illustrates an energy level of the organic light emitting diode display of which $Cu_2S$/ZnS is applied as a core/shell of the quantum dots of the emission layer 173 and p-ZnTe and p-ZnSe are applied to the hole transport layer 171. In addition, FIG. 4 and FIG. 5 show an energy level of the organic light emitting diode display, which is the same as that of FIG. 3, except that $Ag_2S$/ZnS and $In_2S_3$/ZnS are respectively applied as the core/shell of the quantum dots.

In FIG. 3 to FIG. 5, a first direction D1 sequentially represents an energy level 7 of the cathode, a highest occupied molecular orbital (HOMO) energy level 6H and a lowest unoccupied molecular orbital (LUMO) energy level 6L of the electron transport layer, a HOMO energy level 5H and a LUMO energy level 5L of the emission layer, a HOMO energy level 4H and a LUMO energy level 4L of the hole transport layer, and an energy level 3 of the anode.

Further, a second direction D2 represents an energy level (eV) with reference to a vacuum level (VL). The term "work function" indicates energy required to migrate a charge at a Fermi level to a vacuum level (VL). Therefore, the energy levels shown in FIG. 3 to FIG. 5 are equivalent to the absolute value of a work function.

First, the migration of holes injected to the anode will be described.

Holes may be injected from the anode and then reach the HOMO 5H of the emission layer through the HOMO 4H of the hole transport layer.

The hole transport layer and the emission layer of the organic light emitting diode display according to the present exemplary embodiment include materials that have similar energy levels. The energy level 3 of the anode, the HOMO 4H of the hole transport layer, and the HOMO 5H of the emission layer, for example, a migration path of the holes, may have similar energy levels, and accordingly holes can smoothly migrate along the migration path.

The holes may sequentially migrate along the anode, the hole transport layer, and the emission layer with such an energy level.

When electrons migrate from the cathode, the electrons pass through the LUMO 6L of the electron transport layer and reach the LUMO 5L of the emission layer.

In addition, as shown in FIG. 3 to FIG. 5, in a migration path of electrons, from the cathode, the electron transport, and the emission layer, the energy level 7 of the cathode, the LUMO (6L) of the electron transport layer, and LUMO (5L) of the emission layer may also have similar energy levels, and accordingly, electron migration also can be smoothly performed.

As described, according to the exemplary embodiment, the hole transport layer of the organic light emitting element may be formed as a P-type material of which an energy level is similar to a material included in the emission layer such that holes and electrons can be injected in balance, thereby enhancing stability and emission efficiency of the organic light emitting element.

By way of summation and review, in a general OLED display, holes may not be efficiently injected into the emission layer from the hole transfer, thereby creating an undesirable imbalance between electrons and holes.

Embodiments provide an organic light emitting element having excellent stability and emission efficiency, in which holes and electrons including quantum dots may be injected in balance, and an organic light emitting diode display including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A light emitting element, comprising:
   a first electrode;
   a second electrode that faces the first electrode;
   an emission layer between the first electrode and the second electrode, the emission layer including quantum dots having a core/shell structure, wherein the core of the quantum dots of the emission layer includes at least one compound selected from $Cu_2S$ and $Ag_2S$, and the shell of the quantum dots of the emission layer include at least one compound selected from a Group I-VI compound, a Group II-VI compound, and a Group III-VI compound; and
   a hole transport layer between the first electrode and the emission layer, the hole transport layer including quantum dots, wherein the quantum dots of the hole transport layer include at least one compound selected from a p-doped Group I-VI compound, a p-doped Group II-VI compound, and a p-doped Group III-VI compound.

2. The light emitting element as claimed in claim 1, wherein:
   the quantum dots of the hole transport layer each include at least one compound selected from p-ZnTe and p-ZnSe.

3. The light emitting element as claimed in claim 1, wherein:
   the shell of the quantum dots of the emission layer includes at least one of ZnSe or ZnS.

4. The light emitting element as claimed in claim 1, further comprising an electron transport layer between the emission layer and the second electrode.

5. The light emitting element as claimed in claim 4, wherein the electron transport layer includes at least one selected from an n-doped Group I-VI compound, an n-doped Group II-VI compound, and an n-doped Group III-VI compound.

6. The light emitting element as claimed in claim 5, wherein the electron transport layer includes at least one selected from $n-In_2S_3$, $n-Cu_2S$, $n-Ag_2S$, n-ZnO, n-ZnTe, n-ZnSe, and n-ZnS.

7. A light emitting diode display, comprising: a substrate;
   a thin film transistor on the substrate;
   a first electrode connected with the thin film transistor;
   a hole transport layer on the first, electrode, the hole transport layer including quantum dots;
   an emission layer on the hole transport layer, the emission layer including quantum dots having a core/shell structure; and
   a second electrode on the emission layer,
   wherein the core of the quantum dots of the emission layer includes at least one selected from $Cu_2S$ and $Ag_2S$, and the shell of the quantum dots of the emission layer includes at least one selected from a Group I-VI compound, a Group II-VI compound, and a Group III-VI compound, and
   the quantum dots of the hole transport layer include at least one compound selected from a p-doped Group I-VI compound, a p-doped Group II-VI compound, and a p-doped Group III-VI compound.

8. The light emitting diode display as claimed in claim 7, wherein:
   the shell of the quantum dots of the emission layer includes at least one selected from $In_2S_3$, $Cu_2S$, $Ag_2S$, ZnO, ZnTe, ZnSe, and ZnS, and
   the quantum dots of the hole transport layer include at least one selected from $p-In_2S_3$, $p-Cu_2S$, $p-Ag_2S$, p-ZnO, p-ZnTe, p-ZnSe, and p-ZnS.

9. The light emitting diode display as claimed in claim 8, wherein:
   the shell of the quantum dots of the emission layer includes at least one of ZnSe or ZnS, and
   the quantum dots of the hole transport layer include at least-one of p-ZnSe, p-ZnS, or p-ZnTe.

* * * * *